United States Patent [19]

Pelagalli et al.

[11] Patent Number: 6,041,428
[45] Date of Patent: Mar. 21, 2000

[54] CONNECTION MATRIX FOR A MICROCONTROLLER EMULATION CHIP

[75] Inventors: Sergio Pelagalli, Corsico; Marco Losi, Milan, both of Italy

[73] Assignee: STMicroelectronics S.R.L., Agrate Brianza, Italy

[21] Appl. No.: 09/040,249

[22] Filed: Mar. 5, 1998

[30] Foreign Application Priority Data

Mar. 5, 1997 [EP] European Pat. Off. ............. 97830097

[51] Int. Cl.[7] .................................................. G09R 31/28
[52] U.S. Cl. .......................................................... 714/734
[58] Field of Search ................................ 371/22.6, 22.2; 326/39, 40, 41

[56] References Cited

U.S. PATENT DOCUMENTS

| | | | |
|---|---|---|---|
| 4,935,734 | 6/1990 | Austin | 340/825.83 |
| 5,377,148 | 12/1994 | Rajsuman | 365/201 |
| 5,422,838 | 6/1995 | Lin | 365/49 |
| 5,473,267 | 12/1995 | Stansfield | 326/41 |
| 5,479,370 | 12/1995 | Furuyama et al. | 365/189.12 |
| 5,523,705 | 6/1996 | Steele | 326/39 |
| 5,530,378 | 6/1996 | Kucharewski, Jr. et al. | 326/41 |

FOREIGN PATENT DOCUMENTS 90314143  12/1990  European Pat. Off. ..... H03K 19/177

OTHER PUBLICATIONS

Weste & Eshraghian, Principles of CMOS VLSI Design, 2nd Ed., Addison–Wesley, pp. 325–327, 1993.

Noore, Fault tolerant memory designs for improved yield and reliability, IEEE Symposium on Circuits and Systems, pp. 2744–2747, 1990.

*Primary Examiner*—Albert De Cady
*Assistant Examiner*—Samuel Lin
*Attorney, Agent, or Firm*—Theodore E. Galanthay; E. Russell Tarleton; Seed and Berry LLP

[57] ABSTRACT

A connection matrix for a microcontroller emulation chip, which comprises memory cells of the RAM type comprising: first and second MOS transistors connected in series with each other between first and second voltage references, and having their drain terminals in common to form a first internal circuit node; third and fourth MOS transistors, also connected in series with each other between the first and second voltage references, and having their drain terminals in common to form a second internal circuit node; wherein the first and second transistors have their control terminals connected together and to the second internal circuit node, and the third and fourth transistors have their control terminals connected together and to the first internal circuit node; and fifth and sixth MOS transistors, respectively connected between first and second input terminals of the RAM cell and the first and second internal circuit nodes, and having respective control terminals connected to a third input terminal of the RAM cell; further comprising at least one controlled switch connected between the first and second internal circuit nodes adapted to control the switch on/off, and provided with first and second connecting terminals between horizontal and vertical lines of the matrix.

53 Claims, 9 Drawing Sheets

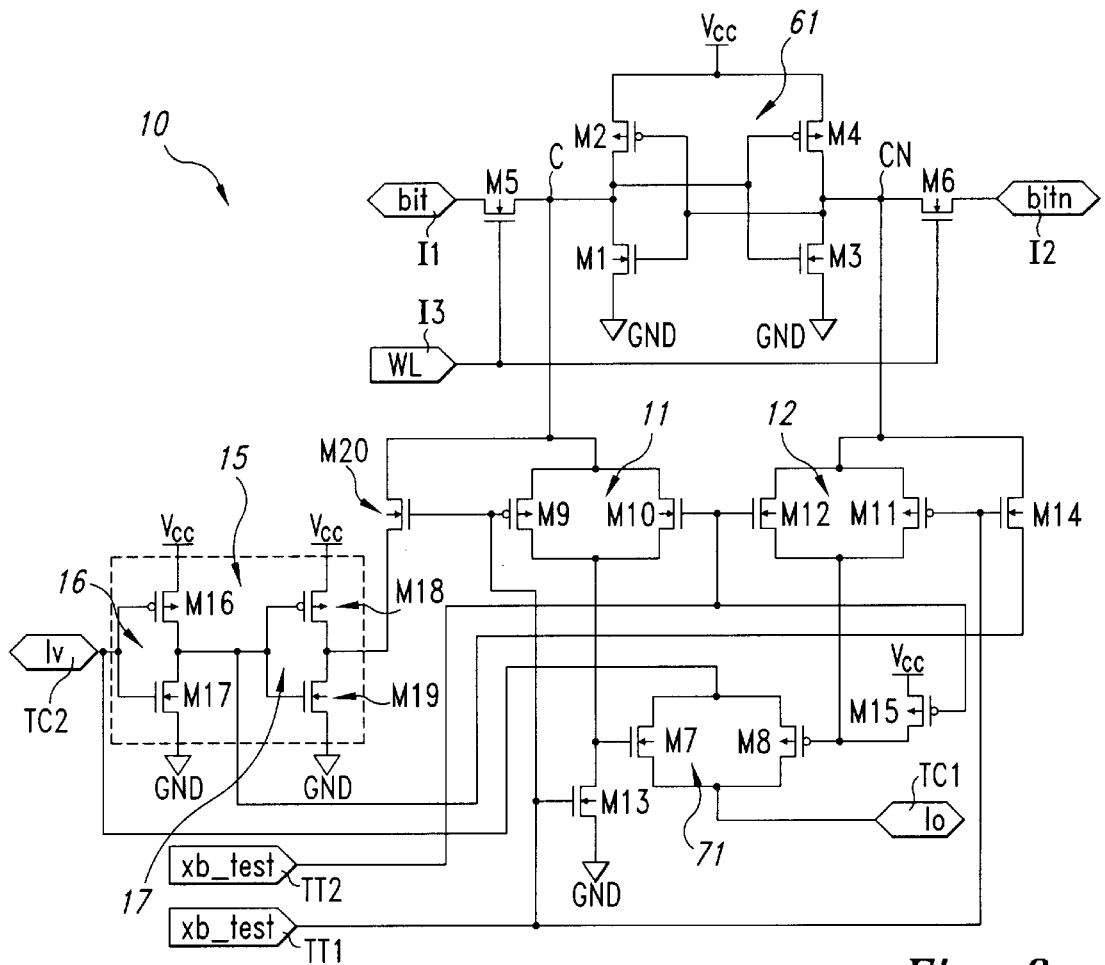
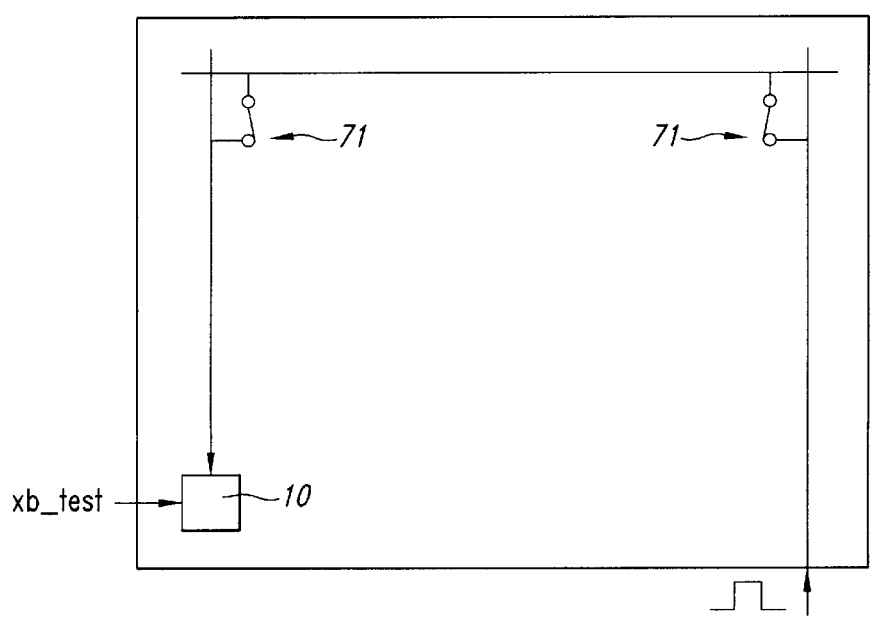
Fig. 8
Fig. 9

CONNECTION MATRIX FOR A MICROCONTROLLER EMULATION CHIP

TECHNICAL FIELD

This invention relates to a connection matrix for a microcontroller emulation chip. More particularly, though not exclusively, the invention concerns a chip which can emulate a microcontroller using libraries of true macro-cells present on the chip and connected by means of connection matrices, and the description to follow will make reference to this particular field for convenience of illustration.

BACKGROUND OF THE INVENTION

As is known, microcontroller integrated circuits or chips are custom made to the requirements of their end users.

Thus, problem arises that the assembling of an individual chip must be optimized, to provide an end product which comes nearest to meeting an individual user's requirements, and to avoid unnecessary redundant subsystems.

The individual chip is, for the purpose, obtained from families of modular systems which can be generally likened to libraries of components including sets of macro-cells performing certain basic functions. The assembling of a predetermined appropriate number of macro-cells from the same family allows a single on-chip system to be obtained.

Thus, an end user will be able to develop some specific application, both hardware- and software-wise, using that chip. Unfortunately, the time for delivery of a chip product to its end user may be quite long (usually 3 to 6 months).

Accordingly, a need for emulating the chip, particularly an operation of the microcontroller therein, does exist so that the end user can start developing his own application and carry on the development work concurrently with the physical construction of the integrated circuit.

Thus, it is a matter of providing a so-called emulation or 'bondout' chip, that is a structure most closely resembling the system which is to be integrated on the chip product for ultimate delivery to the user.

The emulation chip will, therefore, be an integrated circuit which contains a core, all peripherals, and all gates available for a family of microcontroller macro-cells.

Each peripheral can be activated or deactivated to make the microcontroller configuration on the emulation chip similar to that of the microcontroller of the chip product, as by selecting some of the gates and the peripherals from the available ones. In addition, some gates may be used for different purposes to confer maximum flexibility on the emulation chip configuration.

The positioning of the external access pins of the emulation chip is, however, subject to physical as well as logical constraints. Such pins, in fact, must be connectable to structures provided on the chip product to suit the end user's requirements, and be programmable in predetermined sequences.

Also, some of these pins are expected to match on the chip product.

Thus, it is a matter of providing an emulation chip with physical and logical connections, specifically between functional modules and interfacing gates, of a programmable type.

Accordingly, the emulation chip is to include programmable devices adapted for establishing all possible connections between components present on the chip.

A prior approach to filling this demand has been one of storing the connections of the emulation chip into digital logic of the software type, using external registers of the chip, or alternatively, using hardware program contacts to be formed by means of fuses or additional masking of the semiconductor structure of the emulation chip.

Circuits are currently available, such as FPGA and PLD circuits, which operate in this manner by storing a whole netlist of the microcontroller to be emulated. However, these have a drawback in that they operate at speeds below the potential for speed of an emulated circuit.

It is also possible to store connections between input and output terminals by means of a multiplexer. This approach can only be used, however, for a small number, practically a few tens, of the connections to be made.

SUMMARY OF INVENTION

An object of this invention is to provide an emulation chip which has such structural and functional features as to provide for programmability of the physical and logical connections, thereby overcoming the limitations with which prior art devices are beset.

One embodiment of solution on which the present invention stands is to provide a programmable device which can be integrated on an emulation chip, in particular a "connection matrix" adapted to store the physical connections between pins of the emulation chip, along with their program sequences.

The features and advantages of a matrix according to the invention will be apparent from the following description of embodiments thereof, given by way of non-limitative example with reference to the accompanying drawings.

BRIEF DESCRIPTION OF DRAWINGS

FIG. 8 is a detailed circuit diagram of a portion of the testing setup shown in FIG. 7.

FIG. 9 illustrates in schematic form the operation of the testing setup shown in FIG. 7.

DETAILED DESCRIPTION

The emulation chip is an integrated circuit which contains the core, all the peripherals, and all the gates which are available for a family of macro-cells for microcontrollers. In a practical simulation, a family ST9-plus manufactured by this Applicant have been considered.

Figure 1:
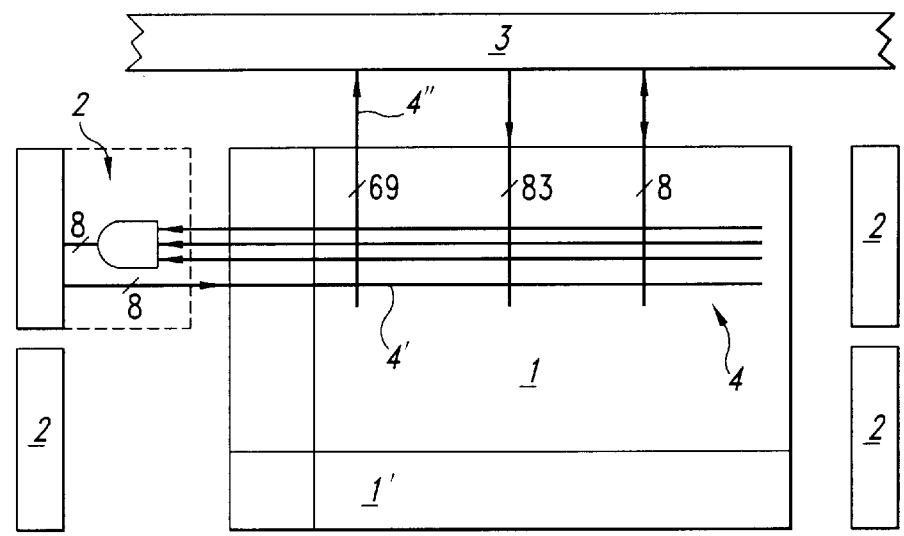
FIG. 1 shows schematically a connection matrix according to the invention.

Referring to the drawing views, schematically shown at FIG. 1 is a connection matrix according to this invention.

In particular, the emulation chip according to the invention provides for the use of memory cells matrices of the RAM type which, when suitably programmed, enable desired connections to be made; this is obtained by means of a switch connected to each memory cell and adapted to close or open according to the contents of that cell.

In the present instance, three memory matrices are used, each adapted to connect four gates for any signal presented on a central bus (referred to as the "frame"). Although not the single possible solution, this would best meet requirements for a microcontroller emulation chip.

Shown schematically in FIG. 1 are connections of the matrix 1 of this invention to a plurality of gates 2 and to a central bus or frame 3.

Specifically, each gate 2 is supplied, through the matrix 1, with a plurality of lines from the frame 3; in addition, each gate 2 supplies further lines on the frame 3, again through the matrix 1, a selection of input lines being carried out within the gates 2 in order to have their number reduced at the output.

Each matrix 1 is connected to several gates 2 by a plurality of lines, on one side of the matrix. Located on the other side of the matrix are all the lines connected to the frame 3, which lines are distributed as follows:

output lines from the matrix 1;

input lines to the matrix 1;

bidirectional lines;

power supply lines, at all events input to the matrix 1.

In the illustrative scheme shown in FIG. 1, given herein by way of example and not of limitation, each gate 2 is supplied, through the matrix 1, with twenty four lines from the frame 3; in addition, each gate 2 supplies, again through the matrix 1, eight lines on the frame 3, a selection being carried out within the gates 2 among the twenty four input lines in order to reduce their number to eight at the output.

Each gate 2 is communicated to the matrix 1 by thirty two lines and, since each matrix 1 is connected to four gates, a total of one hundred and twenty eight lines will be needed on one side of the matrix. On the other matrix side, there will be all the lines connected to the frame 3, which lines are distributed as follows:

sixty nine output lines from the matrix 1;

eighty one input lines to the matrix 1;

eight bidirectional lines;

two power supply lines (Vcc, GND), at all events input to the matrix 1;

totaling one hundred and sixty lines connected to the frame 3.

Therefore, the total number of memory cells included in the matrix 1 can be calculated, in this example, as follows:

Number of cells=160×128=20480 cells=2560 Bytes=2.5 kBytes.

The connection lines comprise, as shown in the view, a plurality of horizontal lines 4' and vertical lines 4" lying orthogonal to one another so as to form a connection "grid" 4; one side of the grid 4 will be connected to the gates 2, and the other to the frame 3.

The RAM matrix 1 of this invention does not store a given number of data, but rather a specific combination of connections resulting in one of the configurations possible for the microcontroller to be emulated. In this way, it becomes possible to act on one configuration of that microcontroller by just re-programming the contents of the memory cells of the matrix 1.

However, the construction of a matrix 1 of this type is subject to some obligations. First, the memory cells employed, although different from a conventional RAM, should be capable of being read/written using the same procedure as with the standard RAMs used for the microcontroller in the chip product.

Secondarily, the signal delay introduced by the passage of the signals through the matrix 1 should be kept as small as possible.

Finally, it should be possible to establish any connections between orthogonal lines, since the positions of the peripherals and the gates around the matrix would not be fixed preliminarily.

It is also expedient that the matrix height should not exceed, if at all possible, the core height, which in the simulation considered was set at about 1850 $\mu$.

Figure 2:
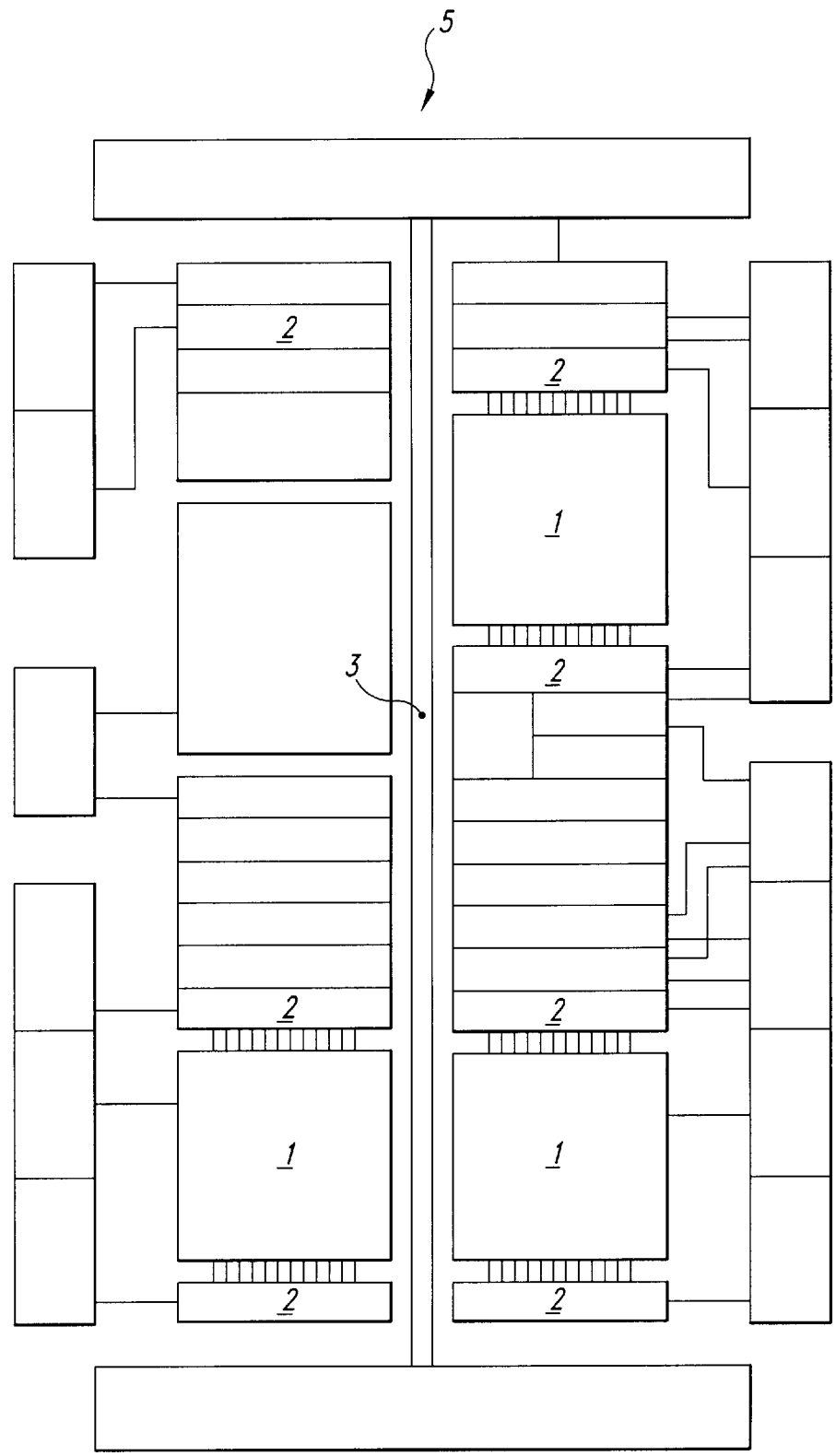
FIG. 2 shows schematically an emulation chip according to the invention.

Shown schematically in FIG. 2 is an emulation chip 5 for the ST9-plus family; this chip is quite large and its surface area is estimated at about 65 mm$^2$.

These large dimensions are bound to introduce delays in the propagation of signals, and accordingly, the performance of the emulation chip 5 will presumably fall somewhat below that of the chip product. However, it should be considered that the usefulness of the emulation chip 5 lies in a faithful replication of the behavior of the chip product, so as to allow the user to obtain information about its operation during a lengthy assembly stage.

In addition, as regards performance in terms of temperature range, supply voltage, and operating conditions, the emulation chip operation is ensured to lie within narrower ranges, thereby making up in part for its inferior performance due to delay in signal propagation.

In FIG. 2, it can be seen that the emulation chip 5 contains no standard memories (RAMs, ROMs, EPROMs, etc.) as are normally provided in every microcontroller of the ST9-plus family; this in order to avoid further expansion of the emulation chip area. The memories, essential as they are to the operation of the chip microcontroller, will be emulated by an external RAM matrix (not shown) which is communicated to the emulation chip 5 through two gates (not shown).

Figure 3:
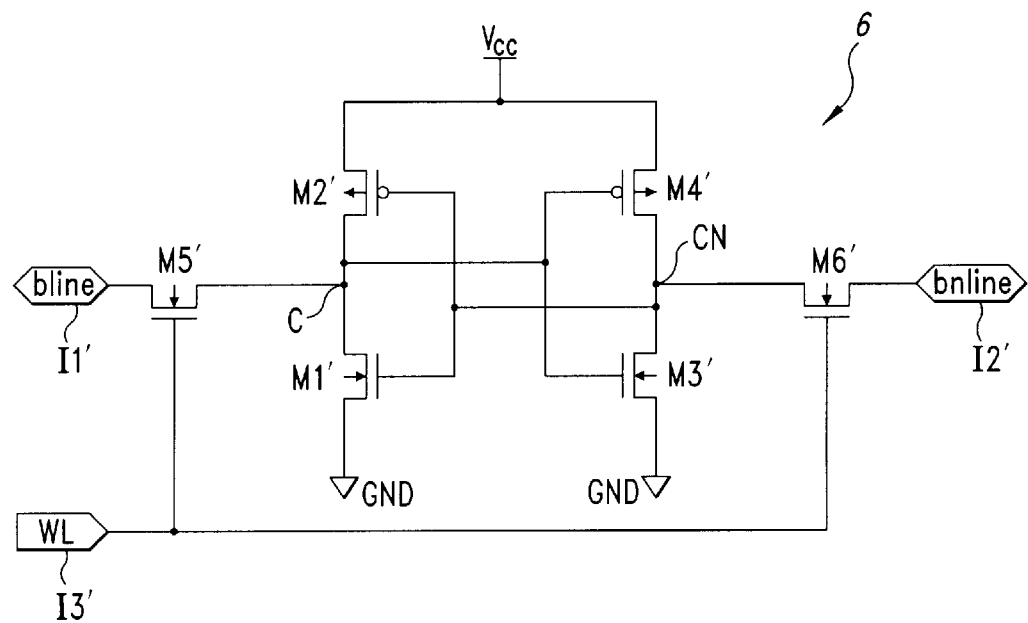
FIG. 3 shows a static RAM cell according to prior art.

In FIG. 3, a conventional static RAM cell 6 is shown. A value stored in a RAM cell is retained therein until a first voltage reference, specifically a supply voltage Vcc is brought to a low level or zero level, or a proper writing operation is applied to the cell.

The memory cell 6 in FIG. 3 comprises first M1' and second M2' MOS transistors, and third M3' and fourth M4' MOS transistors, respectively connected in series with each other between the supply voltage reference Vcc and a second voltage reference, in particular a signal ground GND.

The first M1' and second M2' transistors have their control terminals connected together and to a second common drain terminal of the third M3' and fourth M4' transistors, as well as to a second internal circuit node CN. Likewise, the third M3' and fourth M4' transistors have their control terminals connected together and to a first common drain terminal of the first M1' and second M2' transistors, as well as to a first internal circuit node C.

The cell 6 further comprises fifth M5' and sixth M6' MOS transistors being respectively connected between first I1' and second I2' input terminals and said respective common drain terminals, and having their control terminals connected together and to a third input terminal I3'.

The first I1' and second I2' input terminals are respectively connected to a bit line bline and its logic negation bnline, while the third input terminal I3' receives a signal WL associated with a word line.

From a functional standpoint, the first four transistors M1'–M2', M3'–M4' form an inverter pair which are connected to have an output of the first inverter matched to an input of the second inverter, and vice versa.

The transistors M5' and M6' allow the memory cell 6 to be accessed upon the signal WL attaining a high logic level or 1 level. In order to write a value into the cell 6, values of the bit lines are first forced to two mutually complementary logic values, in the following manner:

if bline=0 and bnline=1, then a 0 is stored;
if bline=1 and bnline=0, then a 1 is stored.

Thus, the cell 6 behaves as a flip-flop, going to a stable state and maintaining it. The basic parameter in this type of memory cell is a dimension ratio R of the transistors M1' and M5', i.e.:

$$R = \frac{W_{M1'}}{W_{M5'}}$$

The voltage at the first internal circuit node C, corresponding to the common drain terminals of the first M1' and second M2' transistors, is actually determined by a threshold voltage of the fifth transistor M5' and the voltage partition between the two resistances from the transistors M1' and M5'. This ratio should be greater than one (in the practical simulation, a value of 1.5 was considered), such that Vds (M1')<Vds(M5'), where Vds is the voltage across the drain and source terminals of a MOS transistor. However, the resistance from the transistor M5' should not be too high, so as not to hinder the writing of a 0 level into the memory cell 6.

It should be noted that the cell 6 would actually be written only by the bit line which happens to be at a 0 level, the other side of the cell 6 being driven to a 1 level by feedback.

In fact, when the bit line bline is at the supply voltage Vcc and the node C is at a ground value GND, the memory cell 6 cannot be switched. This is because the gate-source voltage Vgs of the transistor M1' is equal to Vcc and is much higher than the gate-source voltage Vgs of the transistor M5'. With the same current being flowed through the transistors M1' and M5', the drain-source voltage Vds of the transistor M1' is much lower than the drain-source voltage Vds of the transistor M5' and, therefore, the node C will be at a non-zero voltage not sufficient to switch the second inverter (formed of the transistors M3' and M4').

On the other hand, when the bit line bline is at ground voltage GND and the node C is at the supply voltage Vcc, upon activation of the cell 6 by the transistors M5' and M6', the node C will tend to discharge toward ground. In this way, the voltage at the node C is allowed to switch the second inverter M3'–M4', and the memory cell 6 can be written.

Thus, two bit lines, being precharged to the supply voltage Vcc, should be provided. When a value is to be written in the memory cell 6, one of the bit lines must be suitably discharged, in order to write the correct value in the memory cell 6.

Likewise, in order to read the contents from the memory cell 6, the bit line must be precharged to the supply voltage Vcc; once activated, the memory cell 6 will discharge one of the bit lines, the other bit line remaining at the supply voltage Vcc. Then, a read amplifier arranged to read this voltage difference between the two bit lines will supply the read value to the output stages of the memory.

In the case of the connection matrix 1 of this invention, the standard memory cell 6 has been modified by the introduction of a switch circuit 71 or 72 providing the switching function.

Figure 4:
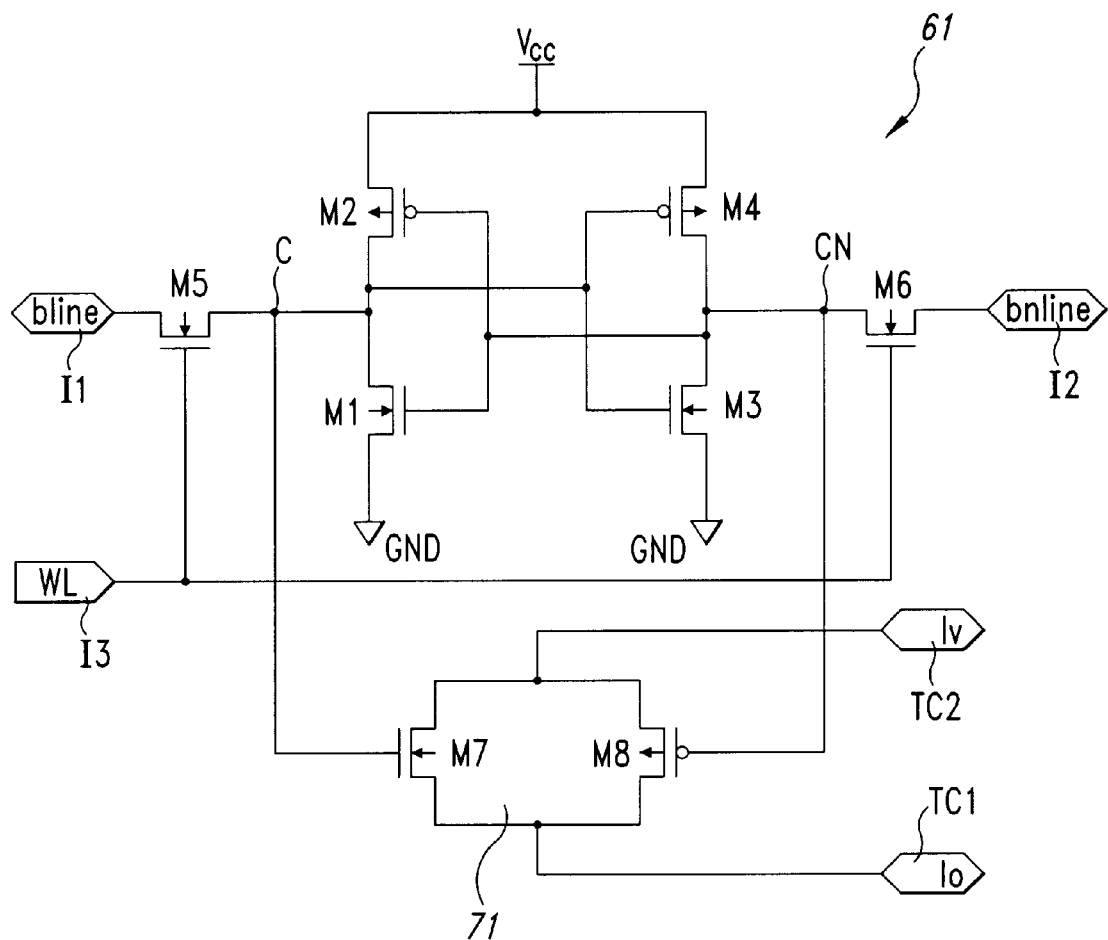
FIGS. 4 and 5 show modified embodiments of a RAM cell with a switch, according to the invention.
Figure 5:
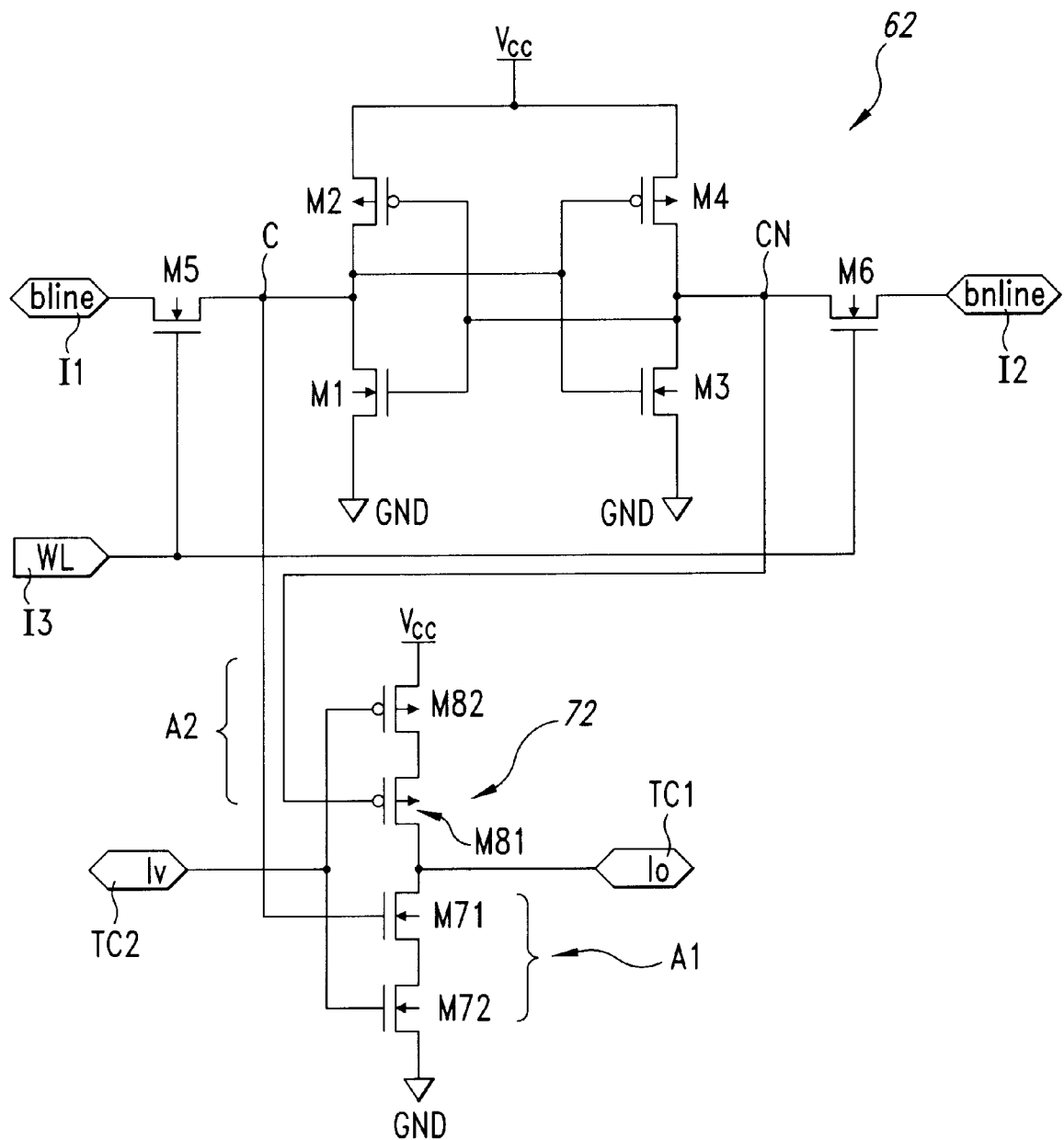

Memory cell 61 or 62 of FIGS. 4 and 5 comprise, like the conventional memory cell 6, first MI and second M2 MOS transistors, and third M3 and fourth M4 MOS transistors which are connected, respectively in series with each other, between a supply voltage reference Vcc and a second voltage reference, specifically a signal ground GND. These transistors M1–M2, M3–M4 are a similar configuration to the transistors M1'–M2', M3'–M4' of the conventional RAM cell 6, and also form an inverter pair connected to have the output of the first inverter match the input of the second, and vice versa.

The cell 61 or 62 further comprises fifth M5 and sixth M6 MOS transistors, respectively connected between first I1 and second I2 input terminals and first C and second CN circuit nodes, which have their control terminals connected to a third input terminal I3.

The first I1 and second I2 input terminals are respectively connected to a bit line bline and its logic negation bnline, while the third input terminal I3 receives a signal WL associated with a word line in the matrix 1.

Advantageously in this invention, the switch circuit 71 or 72 is connected between the first C and the second CN internal circuit node which are operative to control the turning on/off of the switch, and is connected to a first TC1 and a second TC2 connection terminal.

In particular, the state of the switch 71 and a logic value stored in the memory cell are determined by the voltage presented on the internal circuit nodes C and CN, as follows:

if C=0 (GND), CN=1 (Vcc), then switch is off, and stored value=0;
if C=1 (Vcc), CN=0 (GND), then switch is on, and stored value=1.

In this way, a matrix 1 with programmable connections is provided. With a connection established between a horizontal line 4' and a vertical line 4", a logic value of 1 will be stored into the corresponding memory cell, and its associated switch turned on.

Memory cells 61 and 62 thus provided for the connection matrix 1 according to the invention are shown in FIGS. 4 and 5, where two modified embodiments are illustrated which comprise, as the switching circuit:

a CMOS switch 71, comprising first M7 and second M8 transistors of the complementary MOS type which have their control terminals respectively connected to the first C and second CN internal circuit nodes, and have their drain and source terminals in common and respectively connected to the first TC1 and second TC2 connection terminals, thereby acting as pass transistors;

a tristate buffer 72, comprising a first transistor pair A1 connected between the first connection terminal TC1 and the ground GND, and a second transistor pair A2 of the MOS type connected between the supply voltage reference Vcc and the first connection terminal TC1; in particular, the first pair A1 comprise first M71 and second M72 N-channel MOS transistors, with said first transistor M71 having its control terminal connected to the first internal circuit node C, while the second pair A2 comprise first M81 and second M82 P-channel MOS transistors, with said first transistor M81 having its control terminal connected to the second internal circuit node CN; in addition, the respective second transistors M72 and M82 in the transistor pairs A1 and A2 have their control terminals connected in common and to the second connection terminal TC2.

The operation of the novel memory cells 61 and 62 is quite simple:

if the cell 61, 62 has a logic "1" stored therein, both transistors or transistor pairs of the switch circuit 71, 72, being controlled by the voltages presented on the internal circuit nodes C and CN as previously described, will be on and enable a connection between the two connection terminals TC1 and TC2;

if the cell 61, 62 has a logic "0" stored therein, both transistors or transistor pairs will be off and the connection between the terminals TC1 and TC2 disabled.

A memory cell 61 comprising a CMOS transistor switch circuit 71 will be described herein below in greater detail. In fact, this solution has the following advantages:

the area occupied by the CMOS switch circuit 71 is at least one half the area occupied by the tristate buffer 72;

the CMOS switch 71 affords improved flexibility in making the connections between the memory cell and all its neighboring circuits; in fact, when the tristate buffer 72 is used, the memory cells must be positioned inside the matrix one at a time; furthermore, the CMOS switch 71 can, unlike the tristate buffer 72, provide bi-directional connections;

the tristate buffer 72 functions as an amplifier for the memory cell 62, but to have a good drive capacity for the long lines connected to the matrix, the size of the transistors contained in the buffer 72 must be increased, resulting in increased area requirements for the memory cell 62; by contrast, the transistors forming the CMOS switch 71 can expediently be the smallest allowed by the technology used to make the matrix, so long as an external amplifier of the memory cells 61 is provided.

It should be further noted that this minimized size of the transistors included in the CMOS switch 71 brings about two additional advantages, namely minimized area requirements for the whole device, and a minimized capacitive load as seen by each transistor.

In fact, each CMOS transistor switch 71 is to drive a line which is at least as long as the matrix, with the capacitances of the drain terminals of other switches, held off and connected to that line, added thereto. In the particular instance illustrated, to each CMOS switch 71, there are added the capacitances of the drain terminals of at least another one hundred and twenty seven switches in the off state.

An increase in the size of the transistors employed would provide a larger current for charging such capacitances, but would involve still higher capacitance since the area of the one hundred and twenty seven switches held in the off state would also be increased.

There remains to be selected the position of the transistor pair M7, M8 included in the CMOS switch 71 of the memory cell 61, so as to avoid too large an occupation area. The constraints are here fairly tight, since it becomes necessary to use a metallization, commonly termed the third metallization, along a first direction or axis y, and a further metallization, called the second metallization, along a second direction or axis x.

In this way, it becomes possible not to alter too radically the structure of the memory cell, which is to replicate as closely as possible the behavior of the conventional RAM cell 6 ultimately used in the chip product.

The RAM cells 61 are joined to one another by first mirroring them along the axis x and then along the axis y, so as to form groups of four cells for gathering into the overall matrix 1.

In the simulation carried out, the dimensions of the memory cell 61 with the switch circuit 71 were the following:

height=9.4 $\mu$; width=13 $\mu$.

The matrix 1 of this invention further comprises a plurality of redundant cells 63, or "dummy" cells, which are to replicate the operation of the foregoing memory cell 61 only in part. These dummy cells 63 are arranged in between standard cells and I/O circuits to form a dummy row, and between standard cells and a row decoding circuit to form a dummy column, as is the practice with conventional RAMs.

Figure 6:
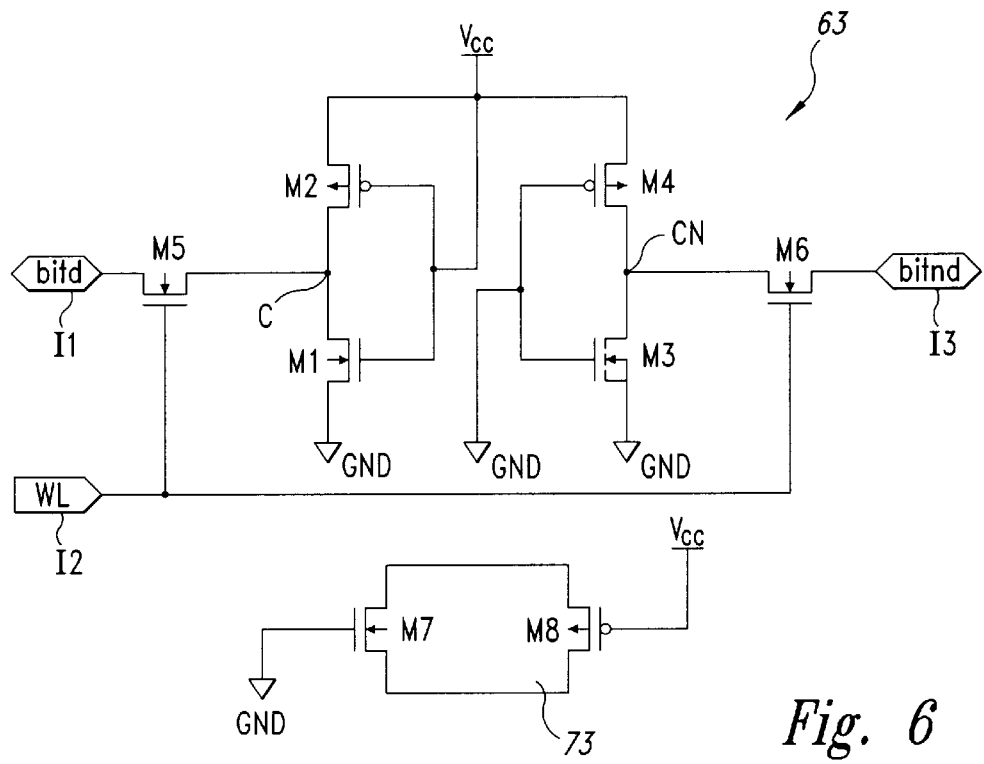
FIG. 6 shows schematically a redundant or dummy RAM cell according to the invention.

A dummy cell 63 is shown schematically in FIG. 6. It also includes components, such as a switch 73 which are unnecessary from a functional standpoint, but needed to provide the same layout as the cells 61. Thus, the same parasitic capacitances are retained, and accordingly, the dummy cells 63 will behave similar to the cells 61, in particular presenting the same reference load.

However, not all of the contacts between the switch 73 and the perpendicular connection lines are provided in the dummy cells 63, in order to avoid the risk of shorting all the lines.

The dummy column cells are forced to always supply the same value to the bit lines bline and bnline; in particular:

bline=0, bnline=1.

Like conventional RAM cells, the dummy row cell is only useful if the number of rows is other than a power of two; in this case, addresses could indeed reach the memory which do not correspond to any memory cells physically present in the matrix. In this situation, no cells are activated, not even the dummy column cells. On the other hand, with the dummy row provided, the cell which locates at an intersection of the dummy row and the dummy column will always be activated.

Figure 7:
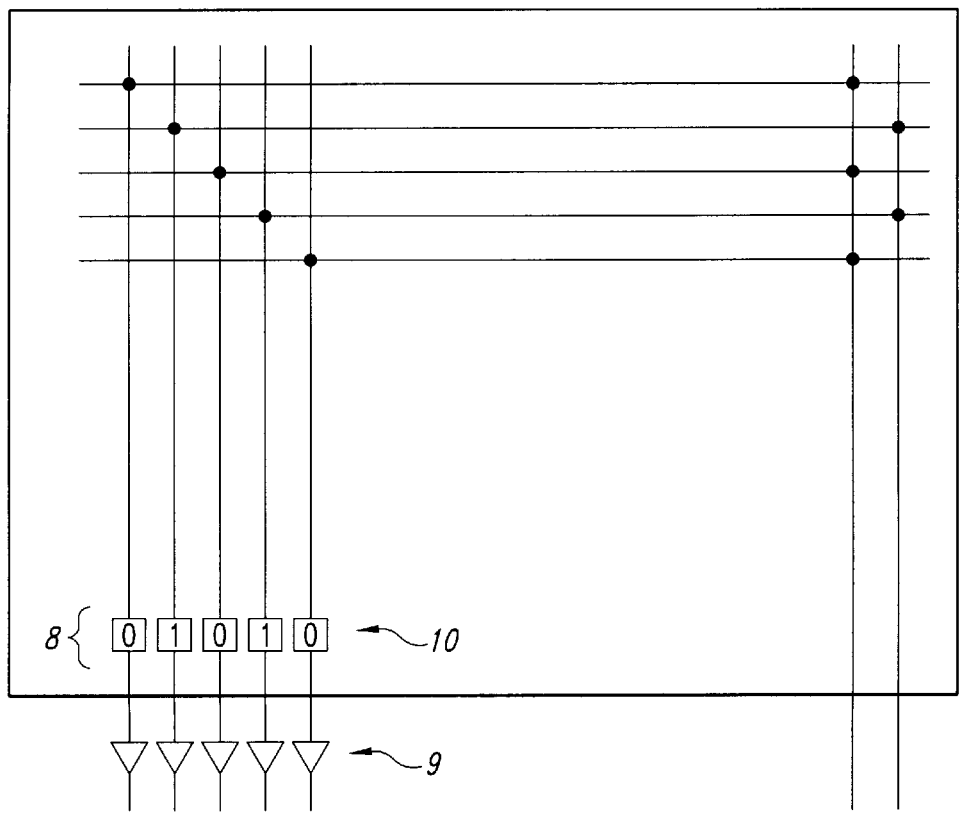
FIG. 7 shows a testing setup for the connection matrix of FIG. 1.

The matrix 1 of this invention is a bi-directional one in the respect of both the vertical connections and the horizontal connections. To restrict the number of bi-directional connections, output buffers 9 are utilized which are placed at each column of the memory matrix 1, as shown in FIG. 7, and can drive a high capacitive load. The output buffers 9 make the lines connected thereto unidirectional, and decouple their capacitive loads.

Of course, the choice memory cells and the output buffers provided will dictate the matrix dimensions and the positions of the connection lines.

The dimensions of the memory matrix 1, in the simulation carried out for illustrative and non-limitative purposes, were the following:

without output buffers: x=1709.15 $\mu$; y=1854.45 $\mu$;

with output buffers: x=1709.15 $\mu$; y=1889.75 $\mu$;

where:

x is the height of the matrix, corresponding to the number of columns; y is the width of the matrix, corresponding to the number of rows.

Using a conventional technological process which can produce at least three levels of metallization, a layout of input and output lines to/from the matrix is a fairly simple matter: the vertical lines, on the x side of the matrix, should be formed with a second-level metallization, and the horizontal lines on the y side of the matrix formed with a third-level metallization.

The peculiar setup of gates according to the invention allows the vertical and horizontal lines to emerge at all events from each side of the matrix.

In the aforementioned simulation, there are one hundred and twenty eight lines exiting the y side, and one hundred and sixty lines exiting the x side. Thus, the gates 2 are to be arranged alongside the matrix 1 as in FIG. 1. Their dimensions, however, are such that they cannot be placed on one side of the memory matrix 1, and the horizontal lines are to exit the matrix 1 on both the right and left sides. This situation forces a further constraint on the line arrangement; the area denoted by 1' in FIG. 1 can only admit one half of the lines 4', 4" because of the presence of I/O circuits whose layout takes up all the metallizations available.

The frame 3 is placed over the matrix 1, on the side where no row decoding circuits are provided.

The positions of the vertical lines are dictated by the layout of the output buffers 9, which forbids an orderly arrangement of the input, output and bi-directional lines on the x side, as explained herein below with reference to FIG. 13.

The connection matrix 1 of this invention, while being similar in operation to RAM matrices for data reading/writing, has a grid-like structure superimposed on it in the form of the metallization lines provided for interconnecting input and output lines. Thus, the matrix 1 can be tested by the same standard procedures as are used for checking the operation of conventional RAMs, plus a procedure specifically for checking the grid 4 operation.

FIG. 7 illustrates a testing setup for the grid 4 of the connection matrix according to the invention. This testing setup has the advantage of being simple and taking up a minimum of area.

Most important is to check the grid 4 for proper passing of signals therethrough. Thus, signals are tested downstream from the logic in the gates 2.

For the purpose of this test, special test cells 10 are used, as shown in FIG. 8, which drive the output buffers 9 on and off.

These special test cells 10 are most suitably incorporated to the matrix 1. It has been found that not all of the switches 71 of the memory cells 61 in the matrix 1 are activated to store up a specific connection pattern, and many of them are never turned on. Thus, it was concluded that some of these inactive cells could be utilized, as suitably modified, for testing the matrix 1.

A special cell 10, whose circuit diagram is shown in FIG. 8, comprises a memory cell 61, as previously described in relation with FIG. 4, connected between the supply voltage reference Vcc and the ground GND.

The first C and second CN internal circuit nodes of the memory cell 61, which correspond to the common drain terminals of the transistors M1–M2 and M3–M4, are suitably connected to the switch 71 via first 11 and second 12 CMOS bypass switches, respectively.

The bypass switches 11 and 12 respectively comprise first M9, M11 and second M10, M12 MOS transistors, in particular P-channel and N-channel transistors, having their source and drain terminals connected together.

The first transistor M9 of the switch 11 has its source terminal connected to the drain terminal of the second transistor M10 and to the internal circuit node C, and, on the other hand, has its drain terminal connected to the source terminal of the second transistor M10 and to the ground GND via a first buffer transistor M13.

In addition, the first transistor M9 of the switch 11 has its control terminal connected to a control terminal of the first buffer transistor M13, and to a first testing terminal TT1.

Likewise, the first transistor M11 of the switch 12 has its source terminal connected to the drain terminal of the second transistor M12 and to the internal circuit node CN, and has its drain terminal connected to the source terminal of the second transistor M12.

Also, the first transistor M11 of the switch 12 has its control terminal connected to a control terminal of a second buffer transistor M14 and to the first testing terminal TT1.

The second transistors M10 and M12 of the switches 11 and 12 have their control terminals connected in common and to a second testing terminal TT2.

The first buffer transistor M13 has its drain terminal connected to the CMOS switch 71 of the memory cell 61 previously described in connection with FIG. 4.

In particular, the first transistor M7 of the switch 71 has its source terminal connected to the drain terminal of the second transistor M8 and to the first connecting terminal TC1 of the special cell 10, and has its drain terminal connected to the source terminal of the second transistor M8 and to the second connecting terminal TC2 of the special cell 10.

Furthermore, the second transistor M8 of the switch 71 has its control terminal connected to the second bypass switch 12 and to the supply voltage reference Vcc via a third buffer transistor M15 having a control terminal connected to the second testing terminal TT2.

The special cell 10 further includes a forcing structure 15, connected between the supply voltage reference Vcc and the ground GND and connected to the second connecting terminal TC2.

In particular, the forcing structure 15 comprises first 16 and second 17 inverters, in turn comprised of first M16, M18 and second M17, M19 P-channel and N-channel transistors, respectively, placed in series with each other and having their control terminals in common.

The first M16 and second M17 transistors of the first inverter 16 have their control terminals connected in common and to the second connecting terminal TC2, and have their drain terminals connected in common and to the common control terminals of the first and second transistors M18, M19 of the second inverter 17, as well as connected to the source terminal of the second buffer transistor M14.

Finally, the first M18 and second M19 transistors of the second inverter 17 have their drain terminals connected in common and to a third buffer transistor M20 which has its drain terminal connected to the internal circuit node C and its control terminal connected to the first bypass switch 11.

The forcing structure 15 decouples the first internal circuit node C from the second control terminal TC2, and suitably controls the first 11 and second 12 bypass switches to enable the special test cell 10 to output the value stored therein.

In the embodiment of the special cell 10 shown in FIG. 8, the buffer transistors M13, M14 and M20 are N-channel transistors, whereas the buffer transistor M15 is a P-channel transistor.

Advantageously in this invention, the first TT1 and second TT2 testing terminals receive a same test signal xb_test which is active at a logic level of 1.

The testing procedure requires that all the tristate output buffers 9 present on the matrix 1 x output side be first disabled; also, all signals from the connection matrix 1 must be locked in the gates 2, so as to isolate the grid 4 from the remainder of the emulation chip.

Figure 13:
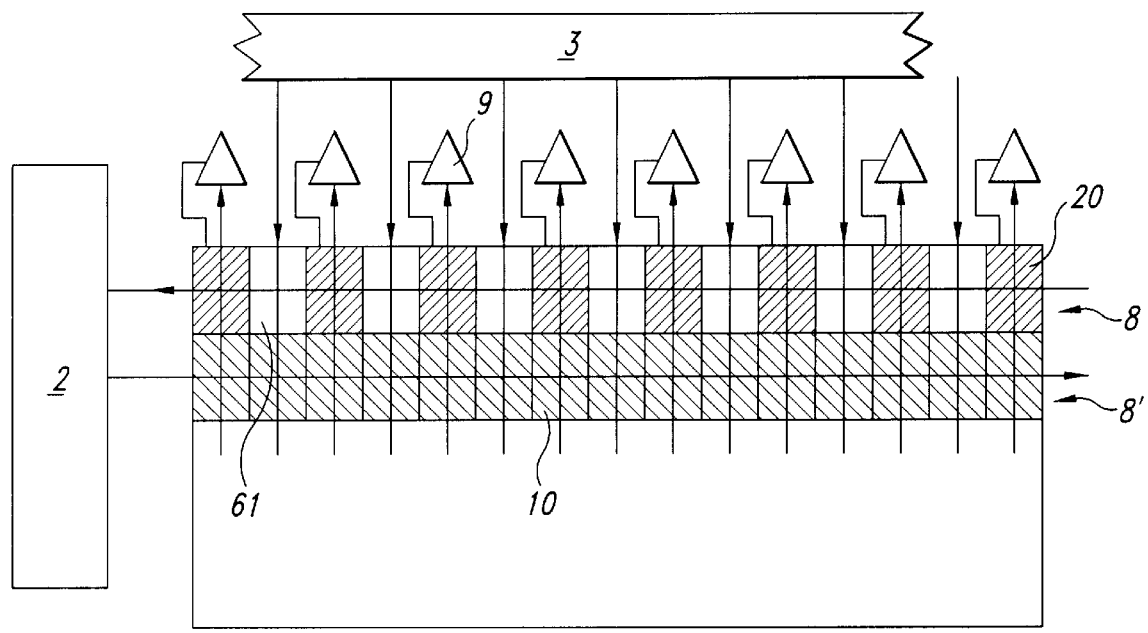
FIG. 13 shows in further detail a portion of the connection matrix of FIG. 1.

Referring to the particular arrangement shown in FIG. 13, it should be noted that all cells in a second row 8' are used for testing the matrix 1.

It should be further noted that it is always possible to arrange for unused cells in a first row 8 of the matrix 1, having no vertical connections, to be utilized for storing up states of the output buffers 9.

The output buffers 9, additionally to isolating the matrix 1 from the rest of the circuit, serve to increase the speed of propagation of the output signals from the matrix 1. Further, input signals to the matrix 1 from the peripherals must be kept deactivated (at a high impedance).

To initialize the line of special cells 10 so as to have no output buffers 9 on when two matrices are connected, a reset circuit is used which is formed by an unused column of the memory matrix 1, which column will effect the initialization of the cells and turning off of the buffers 9 during the test and permit of their turning on once the matrix 1 programming is completed.

It should be noted that, advantageously in this invention, no external logic is used, but only a memory column which is sure to be available (since the number of columns in the matrix 1 is other than a power of two) and a decoding block which is sure to be there and connected to the matrix 1. In the particular exemplary arrangement of FIG. 13, this memory column consists of the cells in the second row from the top, as previously mentioned.

Thereafter, the memory matrix 1 is programmed to connect the two, ground GND and supply Vcc vertical lines 4" to the horizontal lines 4'. Thus, any combinations of signals on these lines 4' and 4" can be created. Lastly, the switches 71 are turned on which connect the horizontal lines 4' to the vertical lines 4" leading to special test cells 10, which can store the logic value contained in the line 4".

The special test cells 10 of this invention operates in either of two modes:

a first mode wherein they behave like the memory cells 61 described hereinabove;

a second mode wherein they behave as test cells.

In particular, if the test signal xb_test presented on the first testing terminal TT1 is at a low logic level, or 0 level, the cell 10 will be operating in the normal operation mode, with the first 11 and second 12 bypass switches in the on state.

In this first operating condition of the cell 10, the buffer transistors M13, M14, M15 and M20 are off. It is therefore possible for the voltages at the internal circuit nodes C and CN to drive the switch 71 in the manner previously described for standard memory cells.

If the test signal xb_test presented on the first testing terminal TT1 is at a high logic level, or 1 level, the cell 10 will be operating in the test mode, with the first 11 and second 12 bypass switches in the off state.

In this second condition of operation of the cell 10, the buffer transistors M13 and M15 are on and contribute respectively to hold the gate terminal of the transistor M7 of the switch 71 grounded and the gate terminal of the transistor M8 of the switch 71 at the value of the supply voltage.

The buffer transistors M14 and M20 are instead on, and effect the connection of the forcing structure 15 to the memory cell 61. Thus, the switch 71 will be off and no connection exists between the terminals TC1 and TC2.

The test cell 10 has therefore a similar construction to standard memory cells, but is written through the forcing structure 15. In fact, when the voltage at the second connecting terminal TC2 is same as the supply voltage value Vcc, the first internal circuit node C is forced to the same voltage value Vcc, whereas the second internal circuit node CN is forced to ground.

Likewise, when the voltage at the second connecting terminal TC2 is same as the ground voltage value GND, the first internal circuit node C is forced to the same voltage value GND, whereas the second internal circuit node CN is forced to the supply voltage value Vcc.

To summarize, when the signal xb_test=1, the switch 71 is disconnected from the memory cell 61, while the nodes C and CN are connected to the vertical line; the latter will transfer the signal carried into the memory cell 61. The signal present on the vertical line is not transferred to the horizontal line because the two buffer transistors M13 and M15, presently in the on state, contribute to turning off the switch 71. When the signal xb_test=0, the connections between the vertical line and the memory cell 61 are deactivated, and the connection between the memory cell 61 and the switch 71 is reset.

It should be noted that the second connecting terminal TC2 receives a control signal 1v which is unable to force the contents of the memory cell 61.

Accordingly, the inverter pair (16,17) need to be added to increase the driving capability of the line and ensure writing into the cell 61.

The combinations used for testing are adequate to allow signals propagating through the grid 4 to be checked as follows:

1) All the horizontal lines 4' are connected to the 0 level (i.e. to the ground GND vertical line); thus, if a 1 level is stored in the special test cells 10, this means that a line, most likely a vertical one, in the grid 4 is shorted to the supply Vcc;

2) All the horizontal lines 4' are connected to the 1 level (i.e. to the supply Vcc horizontal line); in this case, if a 0 level is stored in the special test cells 10, this means that a line, most likely a horizontal one, is shorted to the ground GND.

3) The lines connected to the 0 level are alternated with the lines connected to the 1 level; in this way, the same alternate values should be found at the special test cells 10; if not, there must be a short circuit between two lines.

4) The order of the signals is reversed from the previous case, so as to check not only for short circuits but also for any lines not to be shorted all the time to the supply line Vcc and the ground GND.

FIG. 9 illustrates schematically the operation of the special cell 10 of this invention. The test signal xb_test forces the cell 10 to store up the value of the line connected thereto by means of the forcing structures 15 which enable it to be written, while the output buffers 9 are kept disabled.

Advantageously in this invention, no external register logic, such as a state machine, is therefore needed which would consume silicon area. The special cells 10, being modified for carrying out the test step, are bound to be a larger size, but only trivially so compared to the provision of a separate test logic.

Once the matrix 1 is tested, the signal xb_test reverts to a 0 logic level to allow of normal operation of the cells 10.

Advantageously in this invention, where several matrices are to be connected in parallel to a single line, the output buffers 9 which have an input connected to an output line from the matrix and an output connected to the frame 3 can be utilized. By having the output buffers 9 enabled by a transfer control signal trm from the memory cells, an output signal from the matrix 1 can be communicated to the frame 3. Thus, the output buffers 9 form a multiplexer and decouple the capacitive loads on the matrix lines thus connected.

Figure 16:
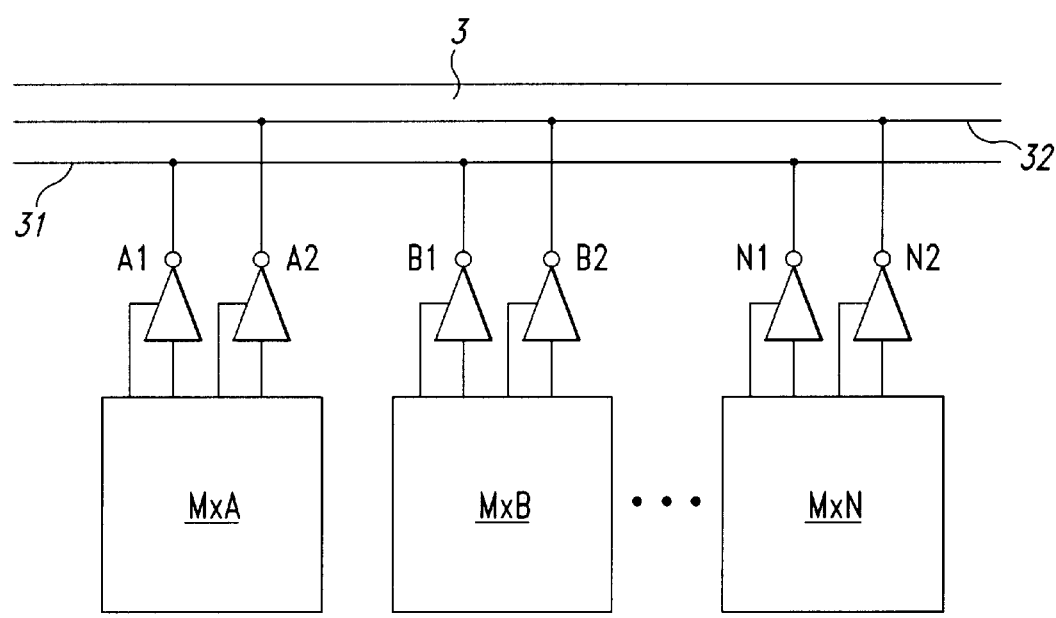
FIG. 16 illustrates schematically the linking of plural matrices according to the invention.

The multiplexer connection formed by the output buffers 9 is shown schematically in FIG. 16. Shown in the view are a plurality of matrices M×A, M×B, . . . , M×N connected to at least a first line 31 and a second line 32 of the frame 3 by first and second pluralities of buffers A1, B1, . . . , N1 and A2, B2, . . . , N2.

The turning on of just one of the first plurality of buffers A1, B1, . . . , N1 will determine which of the matrices M×A, M×B, . . . , M×N is in control of the first line 31. Similarly, the turning on of just one of the second plurality of buffers A2, B2, . . . , N2 will determine which of the matrices M×A, M×B, . . . , M×N is in control of the second line 32. Connections can be reiterated to several lines of the frame 3 by employing additional pluralities of buffers in a similar manner.

In essence, it can be said that a single "virtual" matrix, made up of all the matrices placed on the emulation chip, is created by the output buffers 9 allowing determination of which of the output lines from the matrix 1 is to drive the frame 3.

The size of this "virtual" matrix will be the combined sizes of the individual matrices on the emulation chip. In the non-limitative example shown, the size of this "virtual" matrix is of 128*3=384 lines on the gates 2 side, while on the other side connected to the frame, the buffers 9 form a multiplexer among 160 lines.

Alternatively, several matrices could be connected together through an external multiplexer.

A basic aspect of a circuit like the emulation chip is the introduction of a delay in signal propagation due to the length of the lines interconnecting the various connection matrices in the circuits that comprise the chip.

From the simulation performed, it appears that this delay is quite substantial in the normal operation mode (xb_test= 0).

Figure 10:
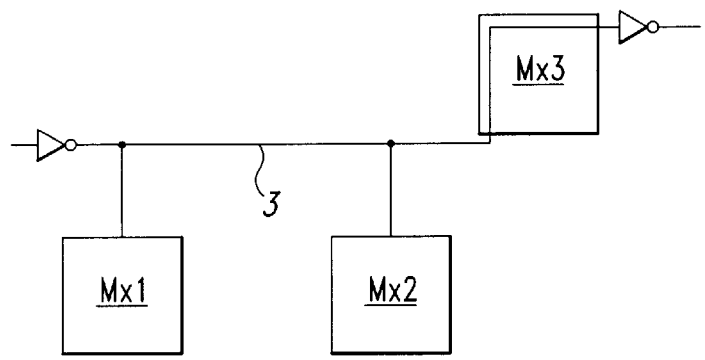
FIGS. 10 and 11 illustrate in schematic form first and second simulation conditions in a critical situation for the connection matrix of FIG. 1.
Figure 11:
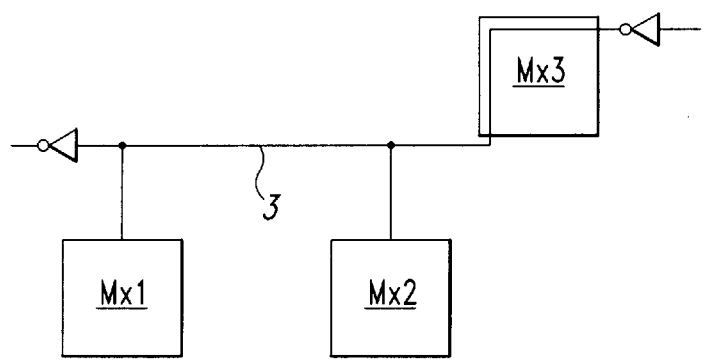

In particular, by the simulation of extreme cases as illustrated in FIGS. 10 and 11, some critical paths have been found within the emulation chip which cause unacceptable delays in the chip operation.

These delays are largely tied to the connection matrices, and it has been decided of acting on the matrices by adding a buffer structure in each output line from the matrix 1.

To provide this buffer structure, it would not be possible to use an inverter pair in each output line from the x side of the matrix 1 and in contact with the frame 3 because, upon turning on the whole emulation chip, the voltage at the first internal circuit node C, and hence the value stored in the memory cells, may take on equal basis either a 0 logic value or a 1 logic value. This situation would result in a random turn-on of the matrix switches and, consequently, in undesired behaviors within the wrongly connected peripherals. Thus, signals from any peripherals of the emulation chip, once input to the matrix 1, should not be allowed to leave it, at least not before the writing step is completed for all the connection matrices.

Accordingly, it has been decided of using output buffers 9 in order to control the outputting of the signal from the matrix. In this way, the feasibility of a single "virtual" matrix including all the matrices of the emulation chip, as mentioned above, is also secured.

Figure 12:
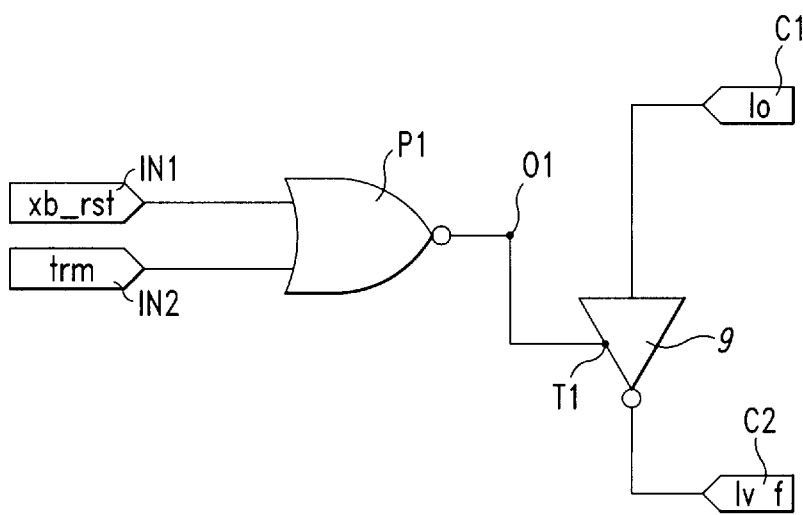
FIG. 12 shows a tristate buffer according to the invention.

For the purpose, the output buffer 9 placed between first C1 and second C2 connecting terminals is connected to a logic gate PL, as shown schematically in FIG. 12, which has first IN1 and second IN2 input terminals respectively receiving a first xb_rst and a second trm transfer control signal, and has an output terminal O1 connected to a drive terminal T1 of the buffer 9.

In the embodiment shown in FIG. 12, the logic gate PL is a NOR gate.

With the introduction of the output buffers 9 thus driven, a simulation of the delays through the emulation chip has yielded highly satisfactory results. Also, the introduction of the output buffers 9 has a further beneficial effect in that the output buffers 9 would decouple from the frame 3 any matrices having their switches in the off state, thereby lowering the capacitance as seen from the active buffer.

The output buffer 9 shown in FIG. 12 affords an additional controlled turn-on feature. Once the connection matrices are fully programmed, it may become necessary to hold the buffers 9 deactivated, or the user may desire to have only some of them enabled to check the operation of just one portion of the circuit. The control signals trm and xb_rst can be used for the purpose. The signal xb_rst enables the turning on of the output buffers 9, whose state is individually determined by the transfer control signals trm.

The values of the signals trm should be stored into a specially arranged enable circuit; in order not to add a set of external registers of the matrix, the following solution is adopted. As previously mentioned, the introduction of the output buffers 9 has imposed a restriction on the positions of the input and output lines to the frame, but on the gate side the line positions can still be selected arbitrarily. If the memory cell column nearest the frame is used for a signal exiting the matrix from the gate side, then many of its cells will never be used for storing a connection (as shown in FIG. 13). These cells are indeed those associated with lines exiting the matrix from the frame side, i.e. lines which are to be driven by the output buffers 9 and, therefore, can be used for storing the bits indicating the state of the output buffer 9. In this way, this function is also programmed by the user suitably writing the memory contents.

Figure 14:
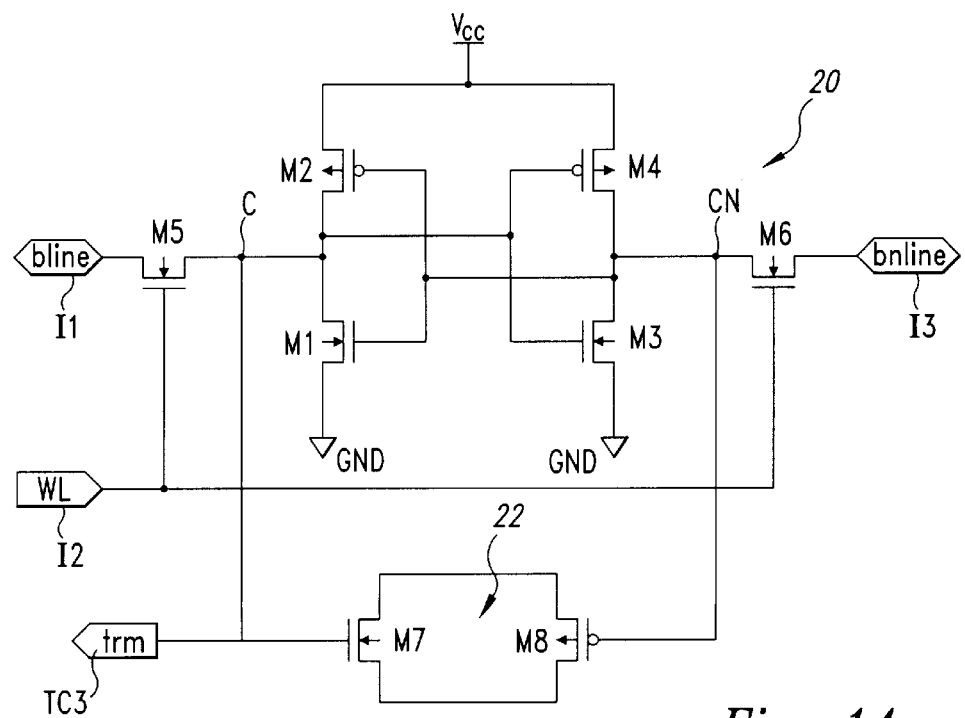
FIG. 14 is a detail view of the connection matrix portion shown in FIG. 13.

An enable cell 20 of this type is shown in detail in FIG. 14. Advantageously in this invention, the enable cell 20 of FIG. 14 is similar to the cell 61 of FIG. 4.

A switch 22 of the enable cell 20 is connected to a single connecting terminal TC3 which delivers the transfer control signal trm. In particular, the connecting terminal TC3 is connected to a control terminal of a first transistor M7 in the switch 22.

It should be noted that, advantageously in this invention, those lines which exit the matrix from the y side, i.e. the side where the gates are located, need special circuits neither to increase their drive capacity, nor to stop the signal propagation. The last-mentioned function is served, in fact, by the gates themselves.

The output buffers 9 are essentially twice as large as the cells of the matrix 1. Accordingly, they have been provided at alternate cells, as shown in FIG. 13, by alternating the input and output lines so as not to waste memory space.

In addition, the bidirectional lines connected to the matrix 1 require an I/O circuit to enable the passing of the signal in the right direction, so as to avoid signal collision.

Figure 15:
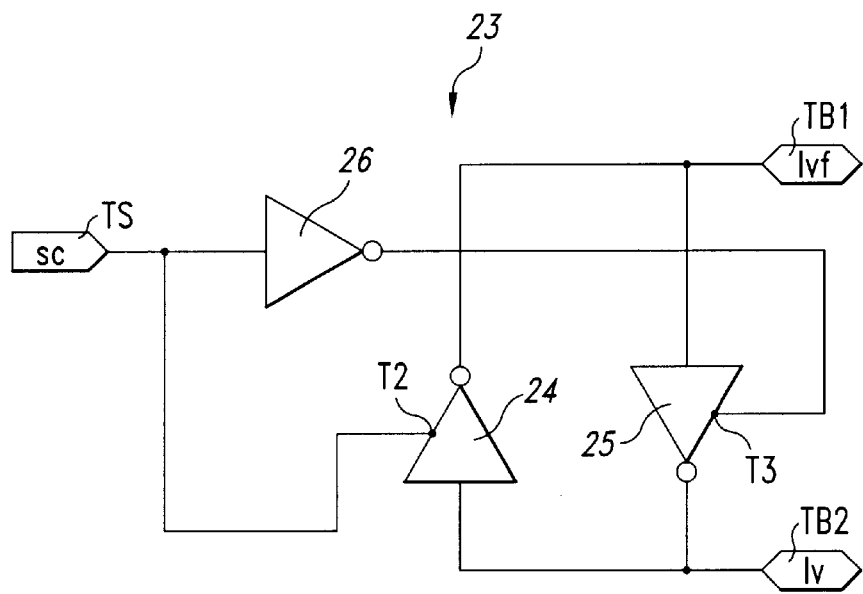
FIG. 15 shows an I/O circuit for the connection matrix of FIG. 1.

This I/O circuit 23, shown schematically in FIG. 15, comprises first 24 and second 25 tristate buffers connected, in phase opposition with each other, between first TB1 and second TB2 input terminals and beings alternately enabled by a clock signal SC.

In particular, the clock signal sc is presented on a clock terminal TS which is connected directly to a drive terminal T2 of the first tristate buffer 24, and to a drive terminal T3 of the second tristate buffer 25 via a logic inverter 26.

Where the signal exits the matrix in the direction toward the frame, the active tristate buffer, 24 or 25, is also effective to enhance the line drive capability. The signals sc are stored into an external register of the matrix.

By using this I/O circuit 23 inside the matrix 1, it becomes possible to have bidirectional lines exiting the matrix, while retaining the directional constraints applied to the matrix 1 by the use of the output butters 9.

Finally, advantageously in this invention, the unused horizontal lines 4' are connected to the power supply lines (either Vcc or GND, according to the downstream logic) such that they cannot be left floating (because made with CMOS technology) and cause, therefore, undesired power consumption.

From the foregoing it will be appreciated that, although specific embodiments of the invention have been described herein for purposes of illustration, various modifications may be made without deviating from the spirit or scope of the invention. Accordingly, the invention is not limited except as by the appended claims.

We claim:

1. A connection matrix for a microcontroller emulation chip, comprising comprising:

first and second MOS transistors connected in series with each other between first and second voltage references, and having their drain terminals in common to form a first internal circuit node;

third and fourth MOS transistors, also connected in series with each other between the first and second voltage references, and having their drain terminals in common to form a second internal circuit node, wherein said first and second transistors have their control terminals connected together and to the second internal circuit node, and said third and fourth transistors have their control terminals connected together and to the first internal circuit node;

fifth and sixth MOS transistors, respectively connected between first and second input terminals of the RAM cell and said first and second internal circuit nodes, and having respective control terminals connected to a third input terminal of the RAM cell;

at least one controlled switch connected between said first and second internal circuit nodes adapted to control said switch on/off, and provided with first and second connecting terminals between horizontal and vertical lines of the matrix;

special test cells connected to first and second testing terminals and comprising a first and second bypass switches connected between said first and second internal circuit nodes and the controlled switch of the special test cells;

a first buffer transistor connected between the first bypass switch and the second voltage reference and connected to the controlled switch of the test cell;

a second buffer transistor connected between the second internal circuit node and the second connecting terminal of the test cell and connected to the first test terminal;

a third buffer transistor connected between the first voltage reference and the controlled switch of the test cell and connected to the second testing terminal; and a fourth buffer transistor connected between the first internal circuit node and the second connecting terminal and connected to the first testing terminal of the test cell.

2. The connection matrix according to claim 1 wherein said controlled switch comprises first and second complementary MOS transistors having their control terminals respectively connected to the first and the second internal circuit node, and their drain and source terminals in common and respectively connected to the first and the second connecting terminal.

3. The connection matrix according to claim 1 wherein said controlled switch comprises a first transistor pair connected between the first connecting terminal and the second voltage reference, and a second transistor pair connected between the first voltage reference and the first connecting terminal, the first transistor pair comprising first and second transistors, said first transistor of the first transistor pair having its control terminal connected to the first internal circuit node, and the second transistor pair comprising first and second transistors, said first transistor of the second transistor pair having its control terminal connected to the second internal circuit node, and the respective second transistors of each pair having their control terminals in common and connected to the second connecting terminal.

4. The connection matrix according to claim 1 wherein said first and second input terminals receive two complementary signals, wherein said connection matrix further comprises redundant cells which replicate only in part the operation of the RAM memory cell and includes a switch connected between said first and second voltage references to avoid shorting the redundant cells.

5. The connection matrix according to claim 4 wherein said redundant cells are placed between the RAM memory cells and I/O circuits to form a redundant row, and between the memory cells and a row decoding circuit to form a redundant column.

6. The connection matrix according to claim 1 wherein said connection matrix comprises a plurality of output buffers placed at each column of the connection matrix and operative to make the capacitive loads unidirectional and to connect all matrices included in the emulation chip.

7. The connection matrix according to claim 6 wherein said special test cells have two distinct modes of operation:

a first mode, in which they behave as standard memory cells; and a second mode, in which they behave as test cells.

8. The connection matrix according to claim 7 wherein the first and second testing terminals of the special test cells receive a same test signal active at a first high logic level.

9. The connection matrix according to claim 7 wherein a second row of said connection matrix only comprises special test cells connected vertically to the plurality of output buffers.

10. The connection matrix according to claim 7 wherein an unused column provides a reset circuit for initializing a line of special test cells, thereby turning off the plurality of output buffers.

11. The connection matrix according to claim 6 wherein said output buffers are connected to a logic gate having a first and a second input terminal respectively receiving a first and a second transfer control signal, and having an output terminal connected to a drive terminal of the output buffer, said first control signal enabling the turning on of the output buffers whose state is determined individually by the second transfer control signal.

12. The connection matrix according to claim 11 wherein the values of the second transfer control signal are stored into a column of enable cells in the connection matrix not used for storing a connection.

13. The connection matrix according to claim 12 wherein said enable cells are structurally similar to standard RAM memory cells and comprise a switch connected between the respective first and second internal circuit nodes, and connected to a single connecting terminal which delivers the second transfer control signal and is also connected to the first internal circuit node.

14. The connection matrix according to claim 6 wherein the output buffers are suitably placed between alternate standard memory cells by alternating input and output lines of the matrix to reduce silicon area consumption.

15. The connection matrix according to claim 1 wherein said special test cells further comprise a forcing structure for forcing the voltage values on said first and second internal circuit nodes, connected between the first and the second voltage reference and connected to both the second connecting terminal and the first internal circuit node of the special test cells.

16. The connection matrix according to claim 15 wherein said forcing structure comprises first and second inverters, being connected in parallel with each other between the first and the second voltage reference and each inverter respectively comprising first and second transistors in series with each other and with their control terminals in common.

17. The connection matrix according to claim 1 wherein said connection matrix comprises an I/O circuit enabling a passing of the signal in a right direction to avoid having signal collisions, said I/O circuit comprising first and second tristate buffers, being connected in phase opposition with each other between first and second input terminals and alternately enabled by a clock signal at a clock terminal of the I/O circuit, in turn connected directly to a drive terminal of the first tristate buffer, and connected to a drive terminal of the second tristate buffer through a logic inverter.

18. The connection matrix according to claim 1 wherein unused cell rows are connected to the first and second voltage references to prevent their being left floating.

19. An integrated circuit for emulating a microcontroller circuit, wherein said integrated circuit comprises at least one programmable connection matrix for establishing connection of predetermined macro-cells, said connection matrix receiving a first and a second voltage references and comprising a memory cell array for storing connection information of the macro-cells and a plurality of test cells, each test cell connected to first and second test terminals and comprising first and second bypass switches connected between first and second internal circuit nodes, respectively, each test cell further comprising a first buffer transistor connected between the first bypass switch and the second voltage reference and connected to a switch circuit of the test cell, a second buffer transistor connected between the second internal circuit node and the second connecting terminal of the test cell and connected to the first test terminal, a third buffer transistor connected between the first voltage reference and the switch circuit of the test cell, and connected to the second test terminal, and a fourth buffer transistor connected between the first internal circuit node and the second connecting terminal, and connected to the first test terminal of the test cell.

20. The connection matrix of claim 19 wherein said memory cells array comprises RAM memory cells, each RAM memory cell storing said connection information of a first and a second line, substantially orthogonal to each other, of the connection matrix and having at least one switch circuit connected between a first and a second internal circuit nodes of the memory cell and adapted to connect a first and a second connecting terminals respectively coupled to the first and the second line of the connection matrix.

21. The integrated circuit of claim 19 wherein the first voltage reference receives a VCC input voltage and the second voltage reference receives a ground voltage.

22. The integrated circuit of claim 20, further comprising a frame bus and a plurality of gates, wherein said each connection matrix establishing connections between a plurality of the first lines to the frame bus and a plurality of the second lines to said gates.

23. The connection matrix of claim 22 wherein said plurality of the first lines are formed with a second-level metallization and said plurality of the second lines are formed with a third-level metallization.

24. The connection matrix of claim 22, further comprising a plurality of output buffer circuits placed at each column of the connection matrix and operative to make capacitive loads of the connection matrix unidirectional and to connect the connection matrix to the frame bus of the integrated circuit.

25. The connection matrix of claim 24 wherein said test cells having a first operation mode functioning as the memory cells and a second operation mode functioning as test cells.

26. The connection matrix of claim 25 wherein the first and the second test terminals of the test cells receive a test signal active at a first high logic level.

27. The connection matrix of claim 26 wherein each test cell further comprises a forcing structure for forcing voltage values on said first and second internal circuit nodes of the test cell, said forcing structure being connected between the first and the second voltage references, and between the second connecting terminal and the first and second internal circuit nodes of the test cell.

28. The connection matrix of claim 27 wherein said forcing structure comprises a first and a second inverter circuits connected in parallel with each other between the first and the second voltage references.

29. The connection matrix of claim 28, said first and second inverter circuits comprising a respective first and second transistors, wherein said first and second transistors of the first inverter circuit having their control terminals connected in common and to the second connecting terminal, and having their drains terminals connected in common and to control terminals of the first and second transistors of the second inverter circuit, said first and second transistors of the second inverter circuit having their drain terminals connected in common and to the fourth buffer transistor of the test cell.

30. The connection matrix of claim 25 wherein a second row of the connection matrix comprises said test cells connected vertically to the plurality of output buffer circuits.

31. The connection matrix of claim 25, further comprising a reset circuit for initializing a line of test cells, said reset circuit being formed by an unused column of the memory cells of the connection matrix and turning off the plurality of the output buffer circuits for initializing the test cells.

32. The connection matrix of claim 24 wherein the connection matrix further comprises a plurality of logic gates, each logic gate being connected to one output buffer circuit and having a first and a second input terminals respectively receiving a first and a second transfer control signals.

33. The connection matrix of claim 32 wherein each said logic gate has an output terminal connected to a drive terminal of the respective output buffer circuit, said first transfer control signal enabling turning on the output buffer circuit whose state is determined individually by the second transfer control signal.

34. The connection matrix of claim 33 wherein values of the second transfer control signals are stored into a column of enable cells not used for storing connections of the connection matrix.

35. The connection matrix of claim 34 wherein said enable cell is structurally similar to the RAM memory cell of the connection matrix, and comprises a switch connected between the respective first and second internal circuit nodes, said switch being connected to a connecting terminal which is also connected to the first internal circuit node and delivers the second transfer control signal.

36. The integrated circuit of claim 24 wherein the plurality of output buffer circuits of all connection matrices form a multiplexer for the connection matrices of the integrated circuit.

37. The connection matrix of claim 24 wherein said plurality of the output buffer circuits are suitably placed between alternate memory cells by alternating input and output lines of the connection matrix to reduce silicon area consumption.

38. The integrated circuit of claim 22 wherein said integrated circuit comprises at least three connection matrix, each being adapted to connect four gates to the frame bus.

39. The integrated circuit of claim 38 wherein each connection matrix has at least one hundred and sixty first lines connected to the frame bus and at least thirty-two second lines to each gate.

40. The integrated circuit of claim 39 wherein said thirty-two second lines comprise twenty-four lines to the gate and eight lines to the connection matrix, and said one hundred and sixty first lines comprise sixty-nine lines to the frame bus, eighty-one lines to the connection matrix, eight bi-directional lines, and two power supply lines.

41. The memory cell of claim 20, comprising:
a first and a second MOS transistors connected in series between the first and the second voltage references, said first and second MOS transistors having respective drain terminals connected in common to form the first internal circuit node;
a third and a fourth MOS transistors connected in series between the first and the second voltage references, said third and fourth MOS transistors having respective drain terminals connected in common to form the second internal circuit node, said first and second MOS transistors having respective control terminals connected together and to the second internal circuit node, and said third and fourth MOS transistors having respective control terminals connected together and to the first internal circuit node; and
a fifth and a sixth MOS transistors, respectively connected between a first and a second input terminals of the memory cell and the first and the second internal circuit nodes, and having respective control terminals connected to a third input terminal of the memory cell.

42. The connection matrix of claim 41 wherein the first and the second input terminals respectively receive a first signal and a second signal complementary to the first, said connection matrix further comprising redundant cells, each redundant cell being replicated only in part an operation of the memory cell and including a switch circuit connected between the first and the second voltage references to avoid shorting the redundant cell.

43. The connection matrix of claim 42 wherein the redundant cells are placed between the memory cells and I/O circuits of the integrated circuit to form a redundant row, and between the memory cells and a row decoding circuit to form a redundant column.

44. The connection matrix of claim 20 wherein the switch circuit comprises a first and a second complementary MOS transistors having control terminals respectively connected to the first and the second internal circuit nodes, and their respective drain and source terminals in common and respectively connected to the first and the second connecting terminals.

45. The connection matrix of claim 20 wherein the switch circuit comprises:
a first transistor pair connected between the first connecting terminal and the second voltage reference, said first transistor pair having a first and a second transistors wherein the first transistor of the first transistor pair has a control terminal connected to the first internal circuit node; and
a second transistor pair connected between the first voltage reference and the first connecting terminal, said second transistor pair having a first and a second transistors wherein the first transistor of the second transistor pair has a control terminal connected to the second internal circuit node, said respective second transistor of each transistor pair having their control terminals connected in common and to the second connecting terminal.

46. The connection matrix of claim 20, further comprising a plurality of I/O circuits enabling a passing of a signal in a direction to avoid signal collisions, said each I/O circuit comprising a first and a second tristate buffers connected in phase opposition with each other between a first and a second input terminals and alternatively enabled by a clock signal at a clock terminal of the I/O circuit, said clock terminal being connected to a drive terminal of the first tristate buffer and to a drive terminal of the second tristate buffer through a logic inverter.

47. The connection matrix of claim 20 wherein unused memory cell rows of the connection matrix are connected to the first and second voltage references to prevent being left floating.

48. A method of forming an emulation circuit for a microcontroller circuit, comprising:
providing at least one connection matrix having test cells connected to first and second test terminals, each test cell comprising:
first and second bypass switches connected between first and second internal circuit nodes, respectively, each test cell comprising;
a first buffer transistor connected between the first bypass switch and a second voltage reference and connected to a switch circuit of the test cell;
a second buffer transistor connected between the second internal circuit node and the second test terminal of the test cell and connected to the first test terminal;
a third buffer transistor connected between the first voltage reference and the switch circuit of the test cell and connected to the second test terminal; and
a fourth buffer transistor connected between the first internal circuit node and the second test terminal and connected to the first test terminal of the test cell;
determining modes of operation, test mode or normal mode, for the emulation circuit;
providing signals to the connection matrix for determining connection information during normal mode of operation;
turning on/off switch circuits of memory cells of the connection matrix according to stored information of the memory cells; and
programming the connection matrix to establish connections among macro cells of the emulation circuit by turning on the switch circuits of the memory cells.

49. The method of claim 48, further comprising:
determining mode of operation for test cells of the connection matrix, wherein in a test mode the test cells function as test cells and in a normal mode the test cells behave as the memory cells;
providing a reset signal to a reset circuit during the test mode;
disabling output buffers of the connection matrix by the reset circuit during the test mode;
providing test signals to first and/or second test terminals of test cells during the test mode;
providing first and second reference voltages, in any combination, to first and second lines of the connection matrix in test mode;

forcing the test cells storing value of lines connected to second connecting terminals of the test cell; and determining logic states of the test cells for a test outcome.

50. The method of claim 48, further comprising providing a first transfer control signal to the connection matrix;

turning on output buffers of the connection matrix during the normal mode of operation;

providing a second transfer control signal to determine states of the output buffers; and storing value of the second transfer control signal of each output buffer into an enable circuit of the emulation circuit.

51. The method of claim 50, further comprising:

providing a clock signal to I/O circuits of the emulation circuit;

enabling a first tristate and a second tristate buffer, in phase opposition, of each I/O circuit by the clock signal; and providing a signal direction control for bidirectional lines of the connection matrix to prevent signal collisions.

52. A microcontroller emulation chip, comprising:

at least one connection matrix connected between a frame bus and a plurality of gates, and adapted to establish connections between a plurality first lines of connection to the frame bus and a plurality of second lines of connection to the gates, the connection matrix further comprising:

first and second MOS transistors connected in series with each other between first and second voltage references, and having their drain terminals in common to form a first internal circuit nodes;

third and fourth MOS transistors, also connected in series with each other between the first and second voltage references, and having their drain terminals in common to form a second internal circuit node, wherein said first and second transistors have their control terminals connected together and to the second internal circuit node, and said third and fourth transistors have their control terminals connected together and to the first internal circuit node;

fifth and sixth MOS transistors, respectively connected between first and second input terminals of the RAM cell and said first and second internal circuit nodes, and having respective control terminals connected to a third input terminal of the RAM cell;

at least one controlled switch connected between said first and second internal circuit nodes adapted to control said switch on/off, and provided with first and second connecting terminals between horizontal and vertical lines of the matrix;

special test cells connected to first and second testing terminals and comprising a first and second bypass switches connected between said first and second internal circuit nodes and the controlled switch of the special test cells;

a first buffer transistor connected between the first bypass switch and the second voltage reference and connected to the controlled switch of the test cell;

a second buffer transistor connected between the second internal circuit node and the second connecting terminal of the test cell and connected to the first test terminal;

a third buffer transistor connected between the first voltage reference and the controlled switch of the test cell and connected to the second testing terminal;

a fourth buffer transistor connected between the first internal circuit node and the second connecting terminal and connected to the first testing terminal of the test cell;

wherein the connection matrix is configured to store into the RAM memory cells the presence or absence of a physical or logical connection between the first and second connection lines.

53. The microcontroller emulation chip according to claim 52 wherein said emulation chip comprises at least three memory matrices, each adapted to connect four gates to the frame bus.

* * * * *